United States Patent
La Rosa et al.

(10) Patent No.: US 10,147,733 B2
(45) Date of Patent: Dec. 4, 2018

(54) METHOD FOR FORMING A PN JUNCTION AND ASSOCIATED SEMICONDUCTOR DEVICE

(71) Applicant: STMicroelectronics (Rousset) SAS, Rousset (FR)

(72) Inventors: Francesco La Rosa, Rousset (FR); Stephan Niel, Meylan (FR); Arnaud Regnier, Les Taillades (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 15/364,603

(22) Filed: Nov. 30, 2016

(65) Prior Publication Data

US 2017/0345836 A1    Nov. 30, 2017

(30) Foreign Application Priority Data

May 31, 2016 (FR) ..................................... 16 54897

(51) Int. Cl.
*H01L 29/66* (2006.01)
*H01L 27/11531* (2017.01)
(Continued)

(52) U.S. Cl.
CPC ...... *H01L 27/11531* (2013.01); *G11C 16/045* (2013.01); *H01L 21/266* (2013.01); *H01L 21/26513* (2013.01); *H01L 21/28273* (2013.01); *H01L 27/0814* (2013.01); *H01L 27/11521* (2013.01); *H01L 27/11526* (2013.01); *H01L 29/16* (2013.01); *H01L 29/66136* (2013.01); *H01L 29/66356* (2013.01); *H01L 29/66825* (2013.01); *H01L 29/7391* (2013.01); *H01L 29/7394* (2013.01); *H01L 29/788* (2013.01); *H01L 29/861* (2013.01); *H01L 27/0629* (2013.01); *H01L 27/11536* (2013.01); *H01L 27/1203* (2013.01); *H01L 29/36* (2013.01)

(58) Field of Classification Search
CPC ........... H01L 29/66356; H01L 29/7391; H01L 29/7394; H01L 29/66136; H01L 29/861
See application file for complete search history.

(56) References Cited

U.S. PATENT DOCUMENTS 6,180,996 B1    1/2001 Onoda et al.
6,437,609 B1    8/2002 Chehadi
(Continued)

FOREIGN PATENT DOCUMENTS

EP    0923132 A1    6/1999
EP    1094604 A1    4/2001

*Primary Examiner* — Phat X Cao
(74) *Attorney, Agent, or Firm* — Slater Matsil, LLP

(57) ABSTRACT

A method can be used to make a semiconductor device. A number of projecting regions are formed over a first semiconductor layer that has a first conductivity type. The first semiconductor layer is located on an insulating layer that overlies a semiconductor substrate. The projecting regions are spaced apart from each other. Using the projecting regions as an implantation mask, dopants having a second conductivity type are implanted into the first semiconductor layer, so as to form a sequence of PN junctions forming diodes in the first semiconductor layer. The diodes vertically extend from an upper surface of the first semiconductor layer to the insulating layer.

23 Claims, 3 Drawing Sheets

(51) Int. Cl.
*H01L 29/739* (2006.01)
*H01L 27/08* (2006.01)
*H01L 27/11526* (2017.01)
*G11C 16/04* (2006.01)
*H01L 21/265* (2006.01)
*H01L 21/266* (2006.01)
*H01L 21/28* (2006.01)
*H01L 27/11521* (2017.01)
*H01L 29/788* (2006.01)
*H01L 29/861* (2006.01)
*H01L 29/16* (2006.01)
*H01L 27/06* (2006.01)
*H01L 27/12* (2006.01)
*H01L 29/36* (2006.01)
*H01L 27/11536* (2017.01)

(56) References Cited

U.S. PATENT DOCUMENTS

2001/0046158 A1* 11/2001 Ishige ............... G11C 16/30
                                                          365/185.18
2007/0267700 A1    11/2007 Russ et al.
2010/0237421 A1*  9/2010 Chou ............... H01L 21/28518
                                                          257/368
2016/0172356 A1*  6/2016 Cheng ............... H01L 27/0629
                                                          257/379

* cited by examiner

METHOD FOR FORMING A PN JUNCTION AND ASSOCIATED SEMICONDUCTOR DEVICE

CROSS-REFERENCE TO RELATED APPLICATIONS

This application claims priority to French Application No. 1654897, filed on May 31, 2016, which application is hereby incorporated herein by reference.

TECHNICAL FIELD

Embodiments of the invention relate to a method for forming a PN junction and an associated semiconductor device. For example, the method could be used for manufacturing a substrate isolated p-n power diode using floating-gate nonvolatile memory technology.

BACKGROUND

FIG. 1 shows an electronic circuit CI suitable for a contactless application including a diode bridge DBr (typically a Graetz bridge) for delivering a direct current voltage VDC from the voltage present at the terminals ACo and AC1 of the antenna ANT1 of the circuit, coupled to the antenna ANT2 of a reader RD.

In this application, the circuit CI includes a latch circuit LTC, conventionally having four transistors T2-T5, adapted to store a digital data element. A reset transistor T1 is also shown, and is controlled by a signal TX delivered by the circuit's processing means COM.

The latch LTC is formed in a box structure N-ISO, itself formed in a semiconductor substrate PSUB. The transistors T1-T3 are formed in a box structure PW, itself formed in the box structure N-ISO. The interfaces between the differently doped box structures form diodes Dpwniso and Dnisopsub.

A current flows in the antenna ANT1 in a direction representative of the data element stored in the latch LTC, so that this element can be read by the reader RD.

The diodes of the bridge DBr, based on polycrystalline silicon, also called polysilicon, are usually formed directly in the substrate PSUB, or in the box structure N-ISO, and this may introduce undesirable bipolar effects.

In fact, recurrent problems have been encountered in the use of diodes whose doped regions are directly implanted in the substrate. These undesirable effects are, for example, due to parasitic PN junctions, and are usually seen in the starting or latching of the circuit.

It is desirable to avoid these parasitic effects in a way which is simple and compatible with non-volatile memory technology.

On the other hand, some dopant diffusion processes in the usual diode manufacturing methods are poorly controlled, for example because of masks requiring strict alignment which is difficult to establish, the defects in this alignment resulting in unpredictability of the characteristics of the diodes.

SUMMARY

Modes of construction and embodiment of the invention relate to PN junction diodes, and more particularly to polycrystalline silicon-based diodes used, for example, to form a bridge rectifier (Graetz bridge) in integrated circuits for use, notably, in contactless telecommunications technologies and incorporating, for example, non-volatile memories.

According to one aspect, a method for manufacturing a plurality of diodes comprises a first implantation of dopants having a second type of conductivity, of the P-type for example, in a first semiconductor layer having a first type of conductivity, of the N-type for example, located on an insulating layer covering a semiconductor substrate and surmounted by projecting regions spaced apart from each other, so as to form a sequence of PN junctions forming the diodes in the first semiconductor layer extending to the insulating layer at the edge of the projecting regions.

The projecting regions, which may advantageously be formed in combination with the forming of floating gates of floating-gate transistors of a non-volatile memory, thus serve as a hard mask for implantation, thus making it possible to clearly delimit the location of the PN junctions, and therefore the dimensions of the space charge areas, while using conventional implantation masks which can also be used for manufacturing non-volatile memories, without the need to provide strict alignment of these masks.

Furthermore, the implantation of the junctions up to the insulating layer makes it possible to suppress bipolar parasitic effects with the underlying substrate.

Although it would be possible to form implantations of the second type of conductivity, of the P-type for example, between each projecting region, so as to produce a series of diodes head to tail, it is particularly advantageous to alternate a P-type implantation with an N-type implantation, making it possible, notably, to form PN diodes which can readily be used in a Graetz bridge.

Thus, according to one embodiment, the method comprises a second implantation of dopants having a first type of conductivity, of the N-type for example, in the first semiconductor layer, so that the first implantation of dopants, of the P-type for example, and the second implantation of dopants, of the N+ type for example, define respectively, in the first semiconductor layer, first areas having the second type of conductivity (of the P+ type for example) overdoped relative to the rest of the first semiconductor layer, and second areas having the first type of conductivity (of the N+ type for example) overdoped relative to the rest of the first semiconductor layer, a first area lying between two second areas and separated from these two second areas by two interleaved regions of the first semiconductor layer located, respectively, under two neighboring projecting regions, each diode being formed at the junction between a first area and an interleaved region.

According to one embodiment, the first areas are of the P+ type of conductivity, forming the anodes of the diodes, the second areas are of the N+ type conductivity, forming the cathodes of the diodes together with the interleaved regions, and the method also comprises the forming of contacts on the first and second areas.

The insulating layer may be of the shallow trench type, and the first semiconductor layer may be formed by a deposit of polysilicon on the insulating layer and implantation by dopants having the first type of conductivity.

Advantageously, the projecting regions comprise a layer of dielectric surmounted by a gate material.

According to one embodiment, the forming of the first semiconductor layer is carried out simultaneously with the forming of floating gates of floating gate transistors, and the forming of the projecting regions is carried out simultaneously with the forming of control grids of the floating gate transistors.

According to another aspect, the invention proposes an integrated circuit comprising, on top of an insulating layer surmounting a semiconductor substrate, a first semiconductor layer having a first type of conductivity, projecting regions spaced apart from each other on the first semiconductor layer, and a sequence of PN junctions forming diodes, extending in the semiconductor layer to insulating layer at the edge of the projecting regions.

According to one embodiment, the integrated circuit comprises, in the first semiconductor layer, first areas having the second type of conductivity, overdoped relative to the rest of the first semiconductor layer, and second areas having the first type of conductivity, overdoped relative to the rest of the first semiconductor layer, a first area lying between two second areas and separated from these two second areas by two interleaved regions of the first semiconductor layer located, respectively, under two neighboring projecting regions, each diode being formed at the junction between a first area and an interleaved region forming a diode.

According to one embodiment, the first areas are of the P+ type of conductivity, forming the anodes of the diodes, the second areas are of the N+ type conductivity, forming the cathodes of the diodes together with the interleaved regions, and the first and second areas also comprise contacts on their surfaces.

The first semiconductor layer may be a layer of polysilicon.

The projecting regions may comprise a layer of dielectric surmounted by a gate material.

Advantageously, some of the diodes form a current bridge rectifier of the Graetz bridge type.

According to one embodiment, wherein the integrated circuit further comprises floating gate transistors each comprising a floating gate and a control gate, the first semiconductor layer is located at the same level as the floating gates of the floating gate transistors, and the projecting regions are located at the same level as the control gates of the floating gate transistors.

The integrated circuit may also comprise a non-volatile memory comprising the floating-gate transistors.

In other words, the various proposed modes of embodiment and construction relate to diodes completely insulated from the substrate. Consequently, no parasitic effect due to a PN junction between a doped region of the diode and the substrate can occur.

On the other hand, the various proposed modes of embodiment and construction have been developed, notably, to be fully compatible with the technological constraints of the use and manufacture of non-volatile memories, particularly non-volatile memories comprising floating gate transistors.

For example, the proposed modes of embodiment enable the diodes to be formed without adding any step, and notably without adding a step of masking which is critical in respect of alignment, to an ordinary method of manufacturing floating gate transistors.

Furthermore, the proposed modes of construction and embodiment are optimized for the technological field, notably as regards the control of the dopant diffusion areas.

The proposed solutions also make it possible to reduce the surface area occupied by the diodes.

BRIEF DESCRIPTION OF THE DRAWINGS

Other advantages and characteristics of the invention will be apparent from a perusal of modes of construction and embodiment of the invention, which are not limiting in any way, and the appended drawings, in which.

DETAILED DESCRIPTION OF ILLUSTRATIVE EMBODIMENTS

Figure 1:
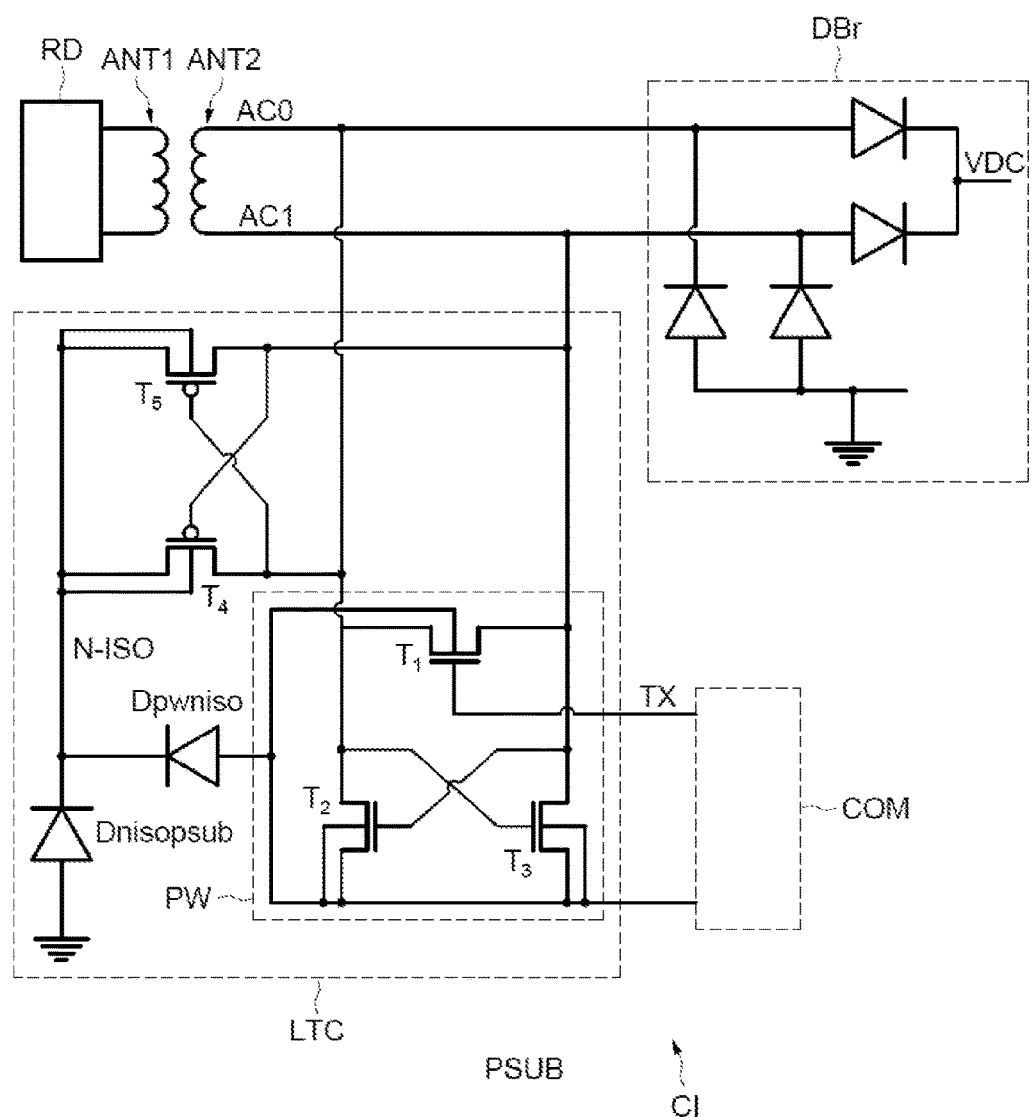
FIG. 1, described above, shows a conventional electronic circuit comprising a diode bridge.
Figure 2:
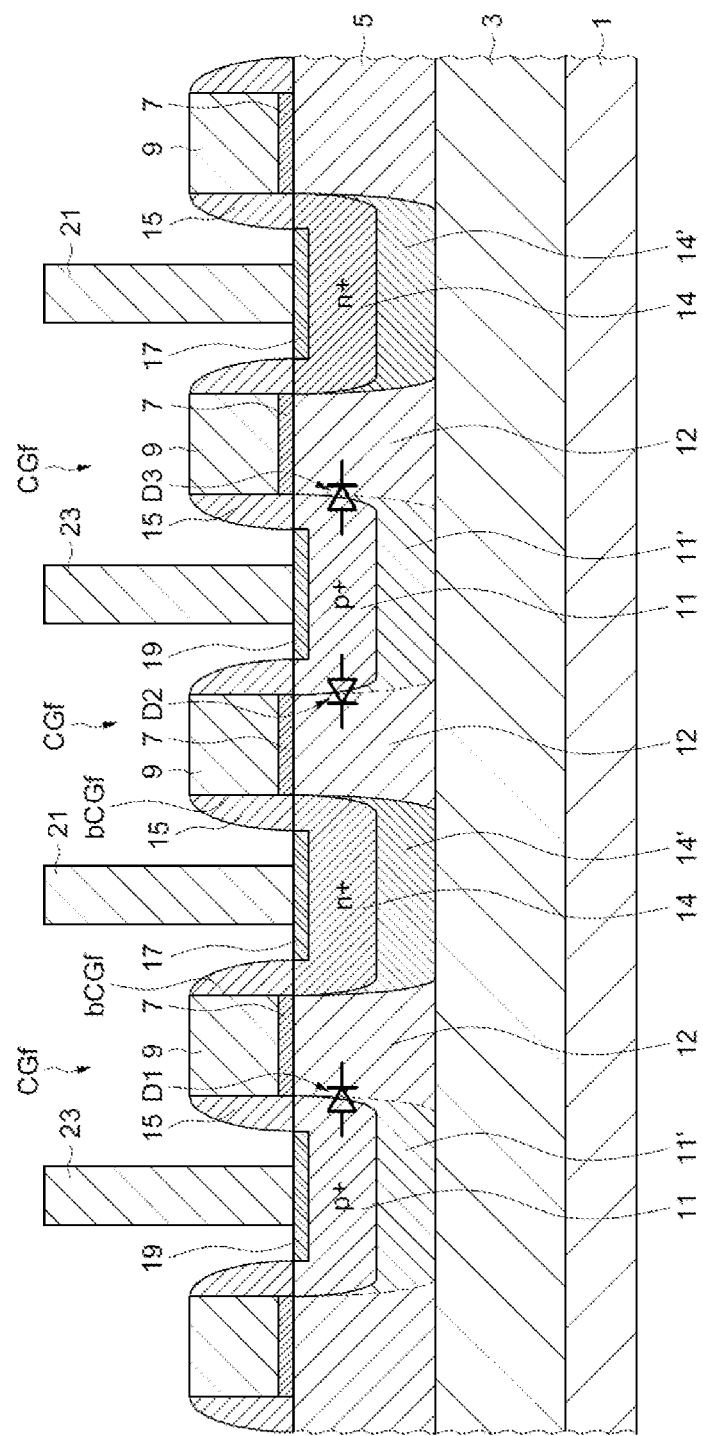
FIG. 2 shows a sectional view of a mode of construction of an integrated circuit according to the invention.

FIG. 2 is a sectional view of an integrated circuit comprising three diodes D1, D2, D3 formed on a semiconductor substrate 1. The semiconductor substrate 1 may be, with reference to FIG. 1, the substrate PSUB itself or a box structure formed in the substrate, for example the box structure N-ISO, again with reference to FIG. 1.

Different manufacturing steps of a method for producing this structure will now be described with reference to FIGS. 2 and 3.

An insulating layer 3 has been formed on the surface of the substrate 1, for example, by a method similar to a conventional known method for forming a shallow insulating trench.

A first semiconductor layer 5, for example a layer of polysilicon doped with a first type of conductivity, of the N-type for example, is then formed on the insulating layer 3.

In a customary method for manufacturing non-volatile memories, this step can be executed jointly with a step of forming polysilicon floating gates of floating-gate transistors.

In the customary method for manufacturing non-volatile memories, control gates of the floating-gate transistors are then formed, usually comprising a layer of dielectric surmounted by a layer of polysilicon. The control gates are, for example, formed in strips extending in a direction orthogonal to the section plane of FIG. 2.

The control gates may also be formed from any other gate material, such as a metal.

Additionally, structures known as "dummies" are commonly added to the functional structures, notably in order to avoid breaks in periodicity which are harmful in some steps of the manufacture of integrated circuits, but they do not usually have any supplementary function.

In the method of forming the diodes D1, D2, D3, a layer of dielectric 7 surmounted by a layer of polysilicon 9 is formed on the surface of the first polysilicon layer 5, forming projecting regions CGf on the surface of the first polysilicon layer.

The projecting regions CGf may advantageously be dummy control gates specified in the context of a method of manufacturing floating-gate transistors.

In this embodiment, the projecting regions CGf are used as a hard mask for forming implantations of dopants in the first polysilicon layer 5.

Figure 3:
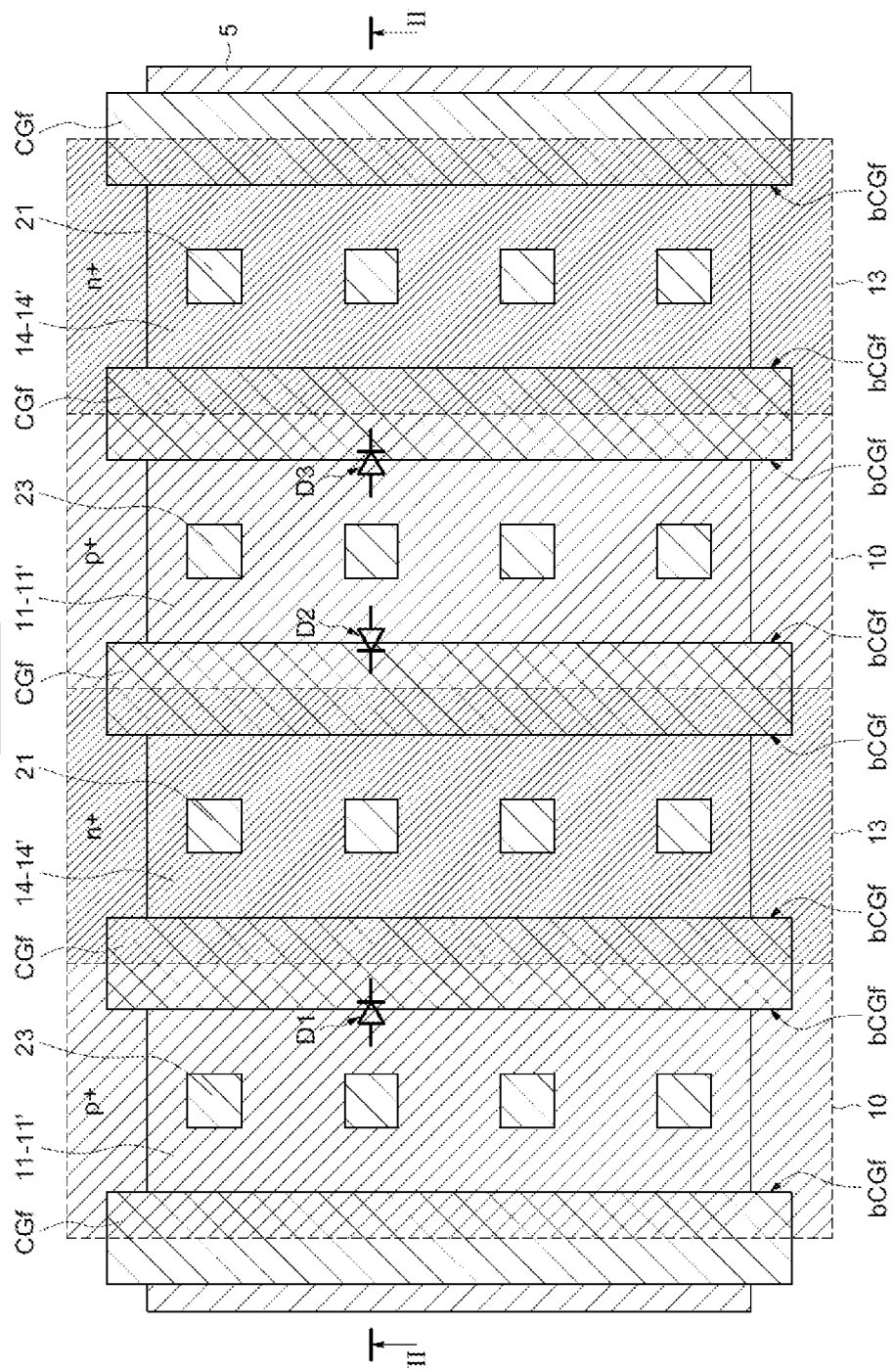
FIG. 3 shows an embodiment of a method according to the invention, and corresponds to a top view of the section of FIG. 2.

As illustrated in FIG. 3, the projecting regions CGf are arranged here in strips extending in a direction orthogonal to the section plane of FIG. 2, represented by the line II-II.

An implantation of dopants having the second type of conductivity (P+) is carried out along first implantation surfaces 10 so as to form first areas 11-11' which are overdoped relative to the doping of the first polysilicon layer 5, for example by having a concentration which is higher by a factor of 100.

The implantation surfaces 10 cover the parts of the first polysilicon layer 5 located between two projecting regions CGf, and may overflow on to a portion of the strips of projecting regions CGf.

This is because, even if the implantation surfaces 10 are poorly aligned relative to a specified implantation surface (that is to say, the polysilicon surface 5 between two projecting regions CGf), the first resulting implanted areas 11-11' will be delimited precisely and regularly by the edges bCGf of the projecting regions CGf.

Consequently, the implantation requires no supplementary critical masking step, particularly in a method including the forming of floating-gate transistors.

This permits a good degree of control of the implantation surfaces, and consequently the lateral distribution of the dopants in the polysilicon layer 5.

The regions of the first polysilicon layer 5 located under the projecting regions CGf are therefore not implanted, and form regions 12 called interleaved regions.

On the other hand, the thickness of the first polysilicon layer 5 and the depth of implantation of the dopants are advantageously designed to be such that the implantation 10 is diffused throughout the thickness of the first polysilicon layer 5, as far as the insulating layer 3.

As a result of the diffusion, the first areas 11-11' comprise a very strongly doped region 11 close to the surface and a deeper less strongly doped region 11', reaching the insulating layer 3.

Thus PN junctions between the first areas 11-11' and the interleaved regions 12 extend to the insulating layer 3 and are located on the edges of the projecting regions bCGf in the first polysilicon layer 5.

Since the dopant implantations are not isotropic, the term "edges of the projecting regions" signifies a region adjacent, or close, to the geometric projection of the contour of the projecting regions in the first polysilicon layer 5.

Implantations of dopants having the first type of conductivity (N+) are carried out in a corresponding manner along second implantation surfaces 13 so as to form second areas 14-14' which are overdoped relative to the doping of the first polysilicon layer 5.

The implantation surfaces 13 cover the parts of the first polysilicon layer 5 located between the edges bCGf of two projecting regions CGf, and may also overflow on to a portion of the projecting regions CGf.

Similarly, the thickness of the first polysilicon layer 5 and the depth of implantation of the dopants are advantageously designed to be such that the implantation is diffused throughout the thickness of the second polysilicon layer 5, forming a very strongly doped region 14 and a less strongly doped region 14' reaching the insulating layer 3.

In this mode of construction and embodiment, one region out of every two regions located between two strips of projecting regions CGf is doped with the first type of conductivity, while the other is doped with the second type of conductivity.

The first areas 11-11' form, with the interleaved regions 12 of the first polycrystalline silicon layer 5, PN junctions extending to the insulating layer 3.

Thus the first areas 11-11' form anode regions and the second areas 14-14' form, with the interleaved regions 12, cathode regions of diodes D1, D2, D3 constructed in this way.

It is then possible to form, in a conventional manner, spacers 15 of a dielectric material placed on the sides of the projecting regions (or dummy control gates) CGf, and contact terminals for the cathodes 17 and anodes 19, for example by siliciding the surfaces of the anode and cathode regions which are not covered by the spacers 15 or the projecting regions CGf, on which metallic cathode contacts 21 and anode contacts 23 are respectively formed.

Thus diodes D1, D2, D3 are produced, formed by a PN junction extending to the insulating layer 3, between an anode formed by a first overdoped area 11-11' and a cathode formed by a second overdoped area 14-14' and an interleaved region 12.

The diodes D1, D2, D3 are therefore completely insulated from the semiconductor substrate 1.

Additionally, in this embodiment, at least one cathode region 14-14' is common to two different diodes, for example the diodes D1 and D2, and lies between two respective anode regions 11-11'. Also, at least one anode region 11-11' is common to two different diodes, for example the diodes D2 and D3, and lies between two respective cathode regions 14-14'.

This configuration with common electrodes is particularly advantageous for the construction of a diode bridge of the Graetz bridge type, having an anode node common to two diodes and a cathode node common to two diodes.

Furthermore, the invention is not limited to the present description, but embraces all variants thereof.

For example, it is feasible for the second implantation 13 to be an implantation of dopants having the second type of conductivity, in a similar manner to the first implantation 10, forming a series of diodes head to tail between the implanted areas and the interleaved areas, the various cathodes being electrically connectable via contacts extending in a plane other than the planes of the attached figures.

What is claimed is:

1. A method of making a semiconductor device, the method comprising:

forming a plurality of projecting regions over a first semiconductor layer having a first conductivity type, wherein the first semiconductor layer is located on an insulating layer overlying a semiconductor substrate, the projecting regions being disconnected strips extending along a top surface of the first semiconductor layer, the disconnected strips being parallel to and spaced apart from each other; and using the projecting regions as an implantation mask, performing a first implantation of dopants having a second conductivity type into first areas of the first semiconductor layer, so as to form a sequence of PN junctions forming diodes in the first semiconductor layer, the diodes vertically extending from an upper surface of the first semiconductor layer to the insulating layer, each of the first areas comprising a first region and a second region, the first region abutting the upper surface of the first semiconductor layer, the second region abutting an upper surface of the insulating layer, the first region having a higher dopant concentration than the second region.

2. The method according to claim 1, further comprising performing a second implantation of dopants having the first conductivity type in the first semiconductor layer, so that each diode includes a heavily doped region of the first conductivity type that is next to a lightly doped region of the first conductivity type that is next to a doped region of the second conductivity type.

3. The method according to claim 1, further comprising performing a second implantation of dopants having the first conductivity type in the first semiconductor layer, wherein the first and the second implantation of dopants, define respectively, in the first semiconductor layer, first areas of the second conductivity type, overdoped relative to other portions of the first semiconductor layer, and second areas of the first conductivity type, overdoped relative to the other portions of the first semiconductor layer, a first area lying between two second areas and separated from these two second areas by two interleaved regions of the first semiconductor layer located, respectively, under two neighboring projecting regions, each diode including a between a first area and an interleaved region, wherein the first areas are of P+ doped regions and form anodes of the diodes, and wherein the second areas are of N+ doped regions and form, together with the interleaved regions, cathodes of the diodes, the method further comprising forming contacts on the first and second areas.

4. The method according to claim 1, further comprising:
forming the insulating layer by performing a shallow trench isolation process; and
forming the first semiconductor layer by depositing polysilicon over the insulating layer and implanting dopants of the first conductivity type.

5. The method according to claim 4, further comprising forming the projecting regions by forming a layer of dielectric and then forming a gate material over the layer of dielectric.

6. The method according to claim 5, wherein forming the first semiconductor layer also includes simultaneously forming floating gates of floating gate transistors and wherein forming the projecting regions also includes simultaneously forming control gates of the floating gate transistors.

7. A method of making an integrated circuit, the method comprising:
forming an insulating layer over a surface of a semiconductor substrate, the insulating layer defining an active region at a first location of the semiconductor substrate and defining a diode region at a second location of the semiconductor substrate;
forming a polysilicon layer having a first conductivity type, the polysilicon layer overlying the insulating layer at the second location;
forming a gate dielectric layer over the polysilicon layer;
forming a conductive layer over the gate dielectric layer;
patterning the polysilicon layer to form a floating gate at the first location, the polysilicon layer being unpatterned at the second location;
patterning the conductive layer to form a control gate overlying the floating gate and to form projecting regions overlying the polysilicon layer at the second location, the projecting regions being disconnected strips extending along a top surface of the polysilicon layer, the disconnected strips being parallel to and spaced apart from each other;
using the projecting regions as a hard mask, implanting dopants of a second conductivity type into first areas of the polysilicon layer so that interleaved regions beneath the projecting regions remain doped with the first conductivity type, each of the first areas comprising a first region and a second region, the second region being interposed between the first region and the insulating layer, the first region having a higher dopant concentration than the second region; and
using the projecting regions as a hard mask, implanting dopants of the first conductivity type into second areas of the polysilicon layer, the second areas of the polysilicon layer being more heavily doped than the interleaved regions, each of the second areas comprising a third region and a fourth region, the fourth region being interposed between the third region and the insulating layer, the third region having a higher dopant concentration than the fourth region.

8. The method according to claim 7, wherein PN junctions are formed at interfaces between the first areas and the interleaved regions, the interfaces adjacent edges of the projecting regions.

9. The method according to claim 7, wherein a plurality of diodes are formed within the polysilicon layer, each diode comprising a heavily doped region of the first conductivity type that abuts a lightly doped region of the first conductivity type that abuts a doped region of the second conductivity type.

10. The method according to claim 7, further comprising forming spacers of a dielectric material of the projecting regions and the control gates.

11. The method according to claim 7, further comprising forming a plurality of dummy control gate structures, the projecting regions comprising ones of the dummy control gate structures.

12. The method according to claim 7, wherein the dopants of the second conductivity type are diffused throughout the polysilicon layer and extend to the insulating layer and wherein the dopants of the first conductivity type are diffused throughout the polysilicon layer and extend to the insulating layer.

13. A method of making a semiconductor device, the method comprising:
forming an insulating layer over a semiconductor substrate;
forming a semiconductor layer over the insulating layer, the semiconductor layer having a first conductivity type;
forming dummy gate structures over the semiconductor layer, the dummy gate structures covering first areas of the semiconductor layer, the dummy gate structures being disconnected strips extending along a top surface of the semiconductor layer, the disconnected strips being parallel to and spaced apart from each other;
using the dummy gate structures as a mask, performing a first implantation of dopants having a second conductivity type into second areas of the semiconductor layer, the second conductivity type being different from the first conductivity type, each of the second areas comprising a first doped region and a second doped region, the first doped region abutting an upper surface of the semiconductor layer, the second doped region being interposed between the first doped region and the insulating layer, the first doped region having a higher dopant concentration than the doped second region; and
using the dummy gate structures as a mask, performing a second implantation of dopants having the first conductivity type into third areas of the semiconductor layer, each of the third areas comprising a third doped region and a fourth doped region, the third doped region abutting the upper surface of the semiconductor layer, the fourth doped region being interposed between the third doped region and the insulating layer, the third doped region having a higher dopant concentration than the fourth doped region.

14. The method according to claim 13, further comprising forming spacers on sidewalls of the dummy gate structures.

15. The method according to claim 13, wherein forming the semiconductor layer over the insulating layer comprises:
forming a polysilicon layer over the insulating layer; and
implanting dopants of the first conductivity type into the polysilicon layer.

16. The method according to claim 13, wherein forming dummy gate structures comprises:
   forming a dielectric layer over the semiconductor layer; and
   forming a conductive layer over the dielectric layer.

17. The method according to claim 13, further comprising siliciding exposed portions of the upper surface of the semiconductor layer.

18. The method according to claim 13, further comprising forming conductive contacts on the second and third areas of the semiconductor layer.

19. The method according to claim 13, wherein each first area is interposed between a respective second area and a respective third area.

20. The method according to claim 13, wherein forming the insulating layer over the semiconductor substrate comprises performing a shallow trench isolation process.

21. The method according to claim 13, wherein PN junctions are formed at interfaces between the first areas and the second areas.

22. The method according to claim 21, wherein the PN junctions extend from the upper surface of the semiconductor layer to the insulating layer.

23. The method according to claim 21, wherein the PN junctions are insulated from the semiconductor substrate.

* * * * *